US009658661B2

(12) United States Patent
Shaw et al.

(10) Patent No.: US 9,658,661 B2
(45) Date of Patent: May 23, 2017

(54) CLIMATE REGULATOR CONTROL FOR DEVICE ENCLOSURES

(75) Inventors: Mark Shaw, Sammamish, WA (US); Matthew Allen Faist, El Dorado Hills, CA (US); Eric C. Peterson, Woodinville, WA (US); Harry Raymond Rogers, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1371 days.

(21) Appl. No.: 13/530,899

(22) Filed: Jun. 22, 2012

(65) Prior Publication Data

US 2013/0344794 A1 Dec. 26, 2013

(51) Int. Cl.
| | |
|---|---|
| G05B 15/02 | (2006.01) |
| G05B 19/042 | (2006.01) |
| G06F 1/20 | (2006.01) |
| H01L 23/473 | (2006.01) |
| H05K 7/20 | (2006.01) |

(52) U.S. Cl.
CPC ......... *G06F 1/206* (2013.01); *H05K 7/20836* (2013.01)

(58) Field of Classification Search
CPC ............................ G06F 1/206; H05K 7/20836
USPC ........ 700/300, 275, 276; 361/687, 691, 695, 361/699
See application file for complete search history.

(56) References Cited

U.S. PATENT DOCUMENTS

| | | | |
|---|---|---|---|
| 4,874,127 A | 10/1989 | Collier | |
| 5,332,886 A | 7/1994 | Schilling et al. | |
| 6,023,402 A | 2/2000 | Kaminski | |
| 6,270,319 B1 | 8/2001 | Lyszkowski et al. | |
| 6,643,128 B2 * | 11/2003 | Chu | G06F 1/206 318/471 |
| 6,826,456 B1 | 11/2004 | Irving et al. | |

(Continued)

OTHER PUBLICATIONS

Kodama, et al., "Power Reduction Scheme of Fans in a Blade System by Considering the Imbalance of CPU Temperatures"—Published Date: Dec. 18-20, 2010, Proceedings: 2010 IEEE/ACM International Conference on Green Computing and Communications, pp. 81-87, http://ieeexplore.ieee.org/stamp/stamp.jsp?tp=&arnumber=5724815.

(Continued)

*Primary Examiner* — Ronald Hartman, Jr.
(74) *Attorney, Agent, or Firm* — Liang IP, PLLC

(57) ABSTRACT

Climate regulation within an enclosure (e.g., a case of a workstation or a rack or cabinet of servers) may be achieved through a climate regulator featuring several selectable climate regulator settings (e.g., a variable-speed fan array). Controllers of such climate regulators often select climate regulator settings based on current conditions inside the enclosure, such as the temperature of one or more processors operating within the enclosure. However, such control fails to account for the climate of air outside the enclosure that is drawn in to provide climate regulation, even though the climate properties of inlet air may significantly affect the effectiveness of climate regulation. Accordingly, a controller of a climate regulator may be configured to detect inlet climate properties of air directed into the enclosure, and to map the inlet climate properties (alone or in combination with other factors) to a selected climate regulator setting for the climate regulator.

20 Claims, 6 Drawing Sheets

(56) References Cited

U.S. PATENT DOCUMENTS

| | | | |
|---|---|---|---|
| 6,996,441 B1 | 2/2006 | Tobias | |
| 7,948,196 B2 | 5/2011 | Begun | |
| 8,165,727 B2 | 4/2012 | Tsutsui | |
| 8,845,188 B2* | 9/2014 | Bash | G01K 1/026 374/1 |
| 8,899,060 B2* | 12/2014 | Hall | G05D 23/1919 361/689 |
| 2003/0011984 A1* | 1/2003 | Chu | G06F 1/206 361/679.48 |
| 2004/0100765 A1 | 5/2004 | Crippen | |
| 2004/0132398 A1* | 7/2004 | Sharp | H05K 7/20609 454/184 |
| 2004/0217072 A1* | 11/2004 | Bash | H05K 7/20736 211/26 |
| 2004/0218355 A1* | 11/2004 | Bash | H05K 7/20745 361/690 |
| 2005/0030171 A1 | 2/2005 | Liu | |
| 2005/0182523 A1 | 8/2005 | Nair | |
| 2008/0232974 A1* | 9/2008 | Tsuchiya | G06F 1/20 417/14 |
| 2008/0306635 A1 | 12/2008 | Rozzi | |
| 2009/0205416 A1* | 8/2009 | Campbell | G01F 1/34 73/202.5 |
| 2010/0110633 A1* | 5/2010 | Gigushinsky | H05K 7/20736 361/695 |
| 2010/0286843 A1* | 11/2010 | Lyon | H05K 7/20836 700/300 |
| 2011/0054705 A1 | 3/2011 | Vaidyanathan | |
| 2011/0093856 A1 | 4/2011 | Campbell | |
| 2011/0125452 A1* | 5/2011 | Bash | G01K 1/026 702/130 |
| 2011/0128699 A1 | 6/2011 | Heydari | |
| 2011/0160916 A1 | 6/2011 | Bahali | |
| 2011/0176275 A1* | 7/2011 | Sato | G06F 1/206 361/695 |
| 2011/0224837 A1 | 9/2011 | Moss | |
| 2011/0228471 A1* | 9/2011 | Humphrey | F04D 27/004 361/679.48 |
| 2011/0292601 A1* | 12/2011 | Campbell | F24F 3/14 361/691 |
| 2011/0307103 A1 | 12/2011 | Cheung | |
| 2012/0010754 A1 | 1/2012 | Matteson | |
| 2012/0116590 A1 | 5/2012 | Florez-Larrahondo | |
| 2012/0226922 A1 | 9/2012 | Wang | |
| 2013/0055744 A1* | 3/2013 | Travers | F24F 11/0012 62/186 |
| 2013/0098599 A1 | 4/2013 | Busch et al. | |
| 2013/0128455 A1* | 5/2013 | Koblenz | G05D 23/1917 361/692 |
| 2013/0158713 A1 | 6/2013 | Geissler | |
| 2014/0052429 A1 | 2/2014 | Kelkar et al. | |
| 2014/0117908 A1 | 5/2014 | Busch et al. | |

OTHER PUBLICATIONS

Robert C., "Thermal Design Insights into the Dell M910 Blade Server"—Published Date: Aug. 11, 2010, pp. 1-2, http://en.community.dell.com/dell-blogs/enterprise/b/inside-enterprise-it/archive/2010/08/11/thermal-design-insights-into-the-dell-m910-blade-server.aspx.

Bean, John, "In-Row® RC Cooling of HP C-Class Chassis"—Published Date: 2007, pp. 1-5, http://www.apcmedia.com/salestools/KSIH-6Z5SGU_R0_EN.pdf.

Kant, Krishna, "Data Center Evolution: A Tutorial on State of the Art, Issues, and Challenges"—Published Date: Dec. 3, 2009, Proceedings: Elsevier Computer Networks Journal, pp. 27 http:! /www .cse. iitb.ac.in/-puru/courses/spring 11/cs620/references/dcevolve. pdf.

Non-final Office Action issued in U.S. Appl. No. 13/714,714 on Mar. 24, 2015, 14 pages.

Final Office Action issued in U.S. Appl. No. 13/714,714 on Oct. 26, 2015, 16 pages.

Notice of Allowance issued in U.S. Appl. No. 13/714,714 on May 16, 2016, 14 pages, 10 pages.

* cited by examiner

CLIMATE REGULATOR CONTROL FOR DEVICE ENCLOSURES

BACKGROUND

Within the field of computing, many scenarios involve an enclosure of a device, such as a cabinet for a computer comprising a set of electronic components (e.g., processors, memory components, and nonvolatile storage devices), where climate regulation within the enclosure is achieved through the use of one or more climate regulators. As one example, because excess heat may disrupt the accurate operation of the components and eventually cause thermal damage, the enclosure may comprise thermal climate regulators, such as a set of fans positioned and configured to draw air into the enclosure, push the air over the components, and expel heated air out of the enclosure as exhaust. More powerful temperature regulation may be achieved through the use of heating components and/or air conditioning components that actively heat or cool the inlet air or the residual air within the enclosure. Other types of climate regulators may manage other climate properties of the enclosure (e.g., humidity regulators may add or remove moisture from the inlet air; air pressure regulators may adjust the air pressure within the enclosure; and air filter regulators may remove particulate contaminants of inlet air). These "active" climate regulators may interoperate with "passive" climate regulators (e.g., heatsinks that physically contact the electronic components and diffuse heat over a large area surface, and filtering screens that trap large particulate matter) to regulate the climate within the enclosure.

Many types of climate regulators provided within an enclosure may present configurable operating settings. For example, fans may be set to operate at faster or slower fan speeds to achieve variable cooling, and a fan array may adjust the number of operating fans. While more powerful climate regulation may be desirable to maintain the climate within the enclosure within a precise range, higher operating rates of climate regulators may involve greater energy expenditure (e.g., higher electricity costs and faster drain of batteries of portable devices) and/or increased noise or vibration within the enclosure. Accordingly, the operating settings of climate regulators may be adjusted by a user and/or automatically by the enclosure.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In many enclosures, the climate regulator settings of climate regulators are adjusted based on detected or predicted climate conditions within the enclosure. As a first example, a temperature gauge may be provided within the enclosure to measure the ambient temperature of the air within the enclosure, or with specific components (e.g., a processor may include a temperature sensor and may report its current temperature to the enclosure), and the climate regulator settings of temperature regulators may be adjusted to maintain current temperatures within an acceptable range. As a second example, the temperature of respective components may be predicted based on the operation of the devices within the enclosure; e.g., the processor load of a processor may vary based on processing demands, and temperature regulators may be adjusted to a higher setting when processor load increases in anticipation of greater heat generation by the processor. As a third example, the settings of the climate regulators may be user-selectable (e.g., an administrator may manipulate a physical switch on a fan or issue an instruction to select a particular climate regulator setting in view of the user's interests, such as to reduce noise).

However, such control systems often neglect to measure a significant factor: the properties of the inlet air that is directed into the enclosure. In many scenarios, this factor may be highly significant (e.g., the temperature within the enclosure may be affected as much or even more by the temperature of air directed into the enclosure as the heat generated by the components). However, many climate regulator control systems do not directly measure and account for such properties, but rather wait for the air directed into the enclosure to alter the conditions within the enclosure, and then adjust the climate regulators according to the current conditions. However, such control systems may be inefficient; e.g., if the air being directed into the enclosure is very cool, it may be undesirable to allow high-powered fans to create large airflow that chills the components and the enclosure before reducing the fan power, because such temperature fluctuations may be inefficient rapid temperature variations may damage the components. Rather, it may be desirable measure the low temperature of the incoming air and reduce fan power in order to maintain the temperature level within the enclosure.

In view of these considerations, the techniques presented herein involve controlling a climate regulator within an enclosure based on the climate properties of the air directed into the enclosure. These techniques involve measuring a climate property of the inlet air; mapping the inlet air to a selection of a climate regulator setting; and instructing the climate regulator to use the selected climate regulator setting. The disclosure further presents variations in these techniques (e.g., directly measuring the climate property or querying a regional climate service for local climate properties, and generating the mapping through trial-and-error or receiving it from the climate regulator or a user). By basing control of the climate regulators through a mapping of the climate properties of the inlet air to a climate regulator setting, a climate regulator control system may enable adaptive climate control of the enclosure through application of the techniques presented herein.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
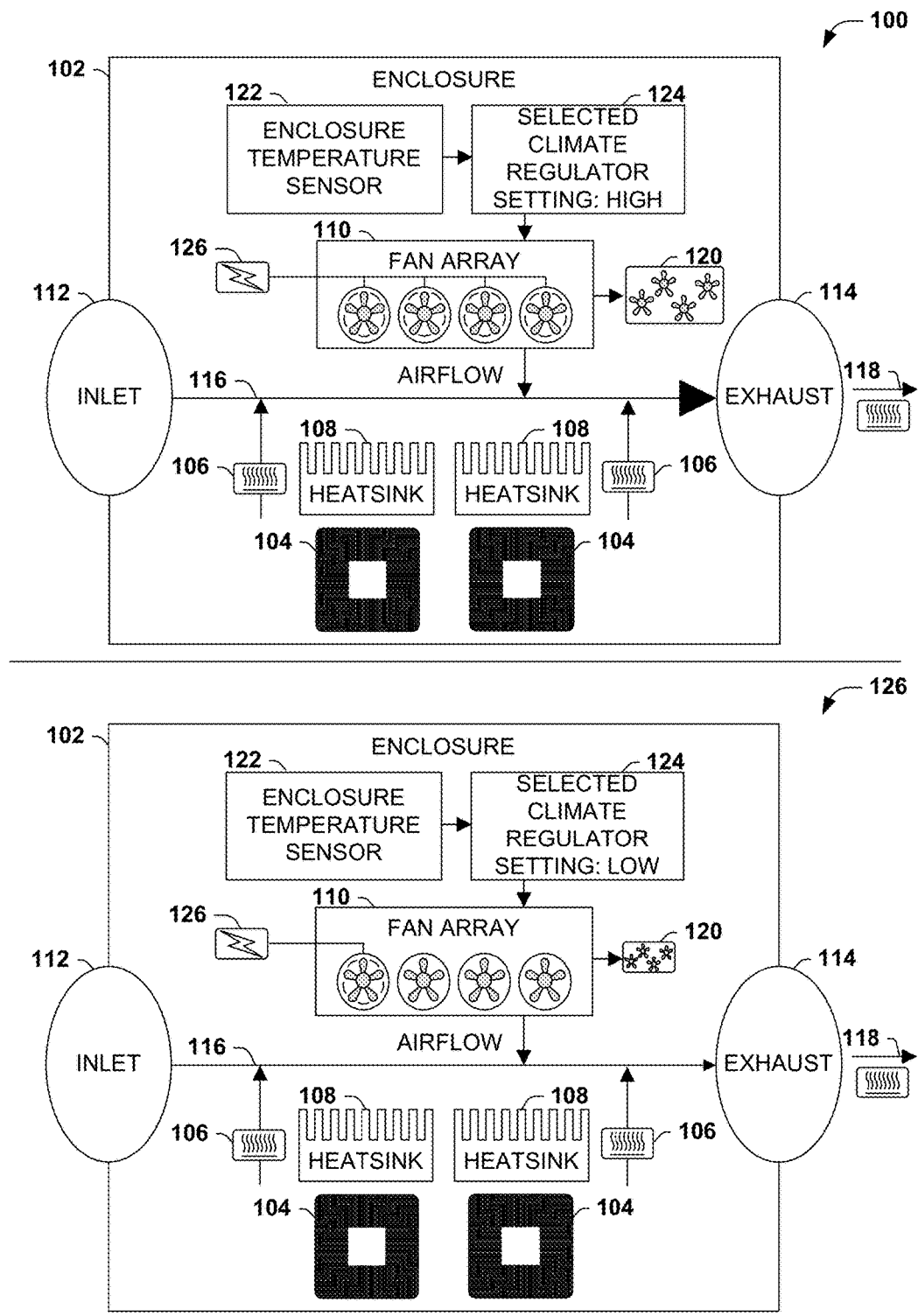
FIG. 1 is an illustration of an exemplary scenario featuring an enclosure comprising a fan array provided to manage air temperature within the enclosure.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

A. Introduction

Within the field of computing, many scenarios involve an enclosure storing one or more devices, such as an enclosure storing a computer comprising a mainboard, one or more processors, volatile and nonvolatile storage, and communications components such as network adapters, or a server cabinet storing components comprising one or more servers. In these scenarios, the air within the enclosure may vary in particular climate properties, such as the temperature, humidity, air pressure, and the reduction of particulate matter (e.g., dust and smoke) of the air within the enclosure. The devices within the enclosure may be sensitive to such properties of the climate; e.g., electronic components may function reliably only within a range of operating temperatures, and excess humidity may disrupt electrical propagation of circuits. Additionally, the operation of the devices may alter such properties, e.g., by generating heat or creating particulate contaminants through friction between moving components, and may exacerbate undesirable climate conditions within the enclosure. The consistent and reliable operation of the devices within the enclosure may therefore depend on regulating various properties of the climate within the enclosure.

In view of these considerations, the enclosure may include one or more climate regulating components that are configured to regulate various properties of the climate within the enclosure. Such regulation may be achieved through "passive" climate regulator devices that present physical and/or chemical properties that provide regulatory capabilities, such as heatsinks comprising conductive metals in physical contact with a device that diffuse excess heat over a wide surface area to facilitate cooling, and screens that trap particulate matter to reduce contamination within the enclosure. Further climate regulation may be provided by "active" climate regulator devices that utilize electric power. For example, the temperature of the air within the enclosure may be regulated by fans, air conditioners, and heaters; humidity regulation may be regulated by humidifiers and dehumidifiers; air pressure may be regulated by compressors; and particulate matter may be regulated by electrostatic air filters.

"Active" climate regulators may often present various operating levels, such as fan speeds of fans; cooling magnitude provided by air conditioners; heat generated by heating units; and the strength of an electrostatic field configured to trap particles. Such operating levels may be controlled, e.g., by a physical switch positioned on the device that a user may manually toggle, or by software instructions generated by a user or device. While utilizing higher operating levels of climate regulators may provide greater climate regulation (e.g., more rapid and/or precise regulation of temperature and more powerful electrostatic removal of particulate matter), higher operating levels may entail undesirable side-effects (e.g., higher fan speeds may generate fan noise; stronger electrostatic fields may create interference with wired or wireless electric or magnetic signals; and higher operating levels may consume more power, thus increasing operating costs and draining batteries in mobile devices). In view of these considerations, it may be desirable to balance higher climate regulation with undesirable side-effects by adapting the operating levels of climate regulator devices in response to conditions within the enclosure, e.g., by configuring control modules to increase the operating levels of climate regulators when circumstances within the enclosure indicate additional climate regulation, and to reduce the operating levels of climate regulators when climate regulation may be acceptably conserved.

FIG. 1 presents an illustration of an exemplary scenario featuring an enclosure 102 of a set of devices 104 (e.g., processors of a computer). The climate within the enclosure 102 may fluctuate in various respects, including the air temperature within the enclosure 102, in part due to heat 106 generated by the operation of the processors 104. In order to regulate air temperature, the enclosure 102 may include a heatsink 108, comprising a block of material in physical contact with each device 104 and exhibiting a high heat conductivity and a high surface area, such that heat 106 generated by the operation of the devices 104 is exposed to a larger volume of air and thus conveyed away from the devices 104. However, such "passive" cooling may be inadequate; e.g., the effectiveness of the heatsinks 108 may diminish as the air temperature within the enclosure 102 rises. Therefore, the enclosure 102 also includes "active" climate regulation in the form of a fan array 110, comprising a series of fans positioned in the enclosure 102 to create airflow across the heatsinks 108. In particular, the fan array 110 may draw air from outside of the enclosure 102 into the enclosure through an inlet 112 and/or may expel air through an exhaust 114 to eliminate exhaust heat 118, thus creating airflow 116 within the enclosure 102 that generates cooling 120 of the climate within the enclosure 102. Moreover, the fan array 110 may be configurable to utilize various climate regulator settings 124 to adapt to conditions within the enclosure 102, e.g., by applying power 126 to more or fewer fans in the fan array 110 to alter the magnitude of cooling 120. Therefore, the enclosure 102 also includes an enclosure temperature sensor 122 that detects air temperature within the enclosure 122 to determine the amount of cooling 120 desired. The enclosure 102 may therefore generate selected climate regulator settings 124 to suit the current climate conditions within the enclosure 102. For example, at a first time point 100, the enclosure temperature sensor 122 may measure a high air temperature within the enclosure 102, and may send to the fan array 110 a "high" selected climate regulator setting 124. The fan array 110 may apply the selected climate regulator setting 124 by delivering power 126 to all of the fans in the fan array 110, thus creating a large amount of airflow 116 to achieve greater cooling 120 in order to provide rapid cooling 120 of the air temperature within the enclosure 120. Alternatively, at a second time point 126, the enclosure temperature sensor 122 may measure an acceptable air temperature within the enclosure 102, and the fan array 110 receive a "low" selected climate regulator setting 124 and apply it by delivering power 126 only to one fan of the fan array 110, thereby providing reduced airflow 116 and reduced cooling 120 within the enclosure 120. In this manner, the enclosure 102 may control the operation of the fan array 110 to provide variable levels of cooling 120 in response to conditions within the enclosure 102.

B. Presented Techniques

The techniques presented in the exemplary scenarios of FIG. 1 may achieve variable climate regulation within the enclosure 102 based on conditions within the enclosure— e.g., the air temperature within the enclosure 102—but may fail to account for the properties of air outside the enclosure 102 that is directed into the enclosure 102 through the inlet 112 by the fan array 110. It may be appreciated that the effectiveness of the fan array 110 may be significantly determined by these properties. As a first example, if the air outside of the enclosure 102 is warm, the temperature differential of the airflow 116 and the heatsinks 108 may be comparatively small, and adequate cooling may involve a greater amount of airflow 116. Conversely, if the air outside of the enclosure 102 is cool, adequate airflow 116 may be achievable at a lower climate regulator setting 124. As a second example, if the air outside of the enclosure is hot, operating the fan array 110 at a high setting 124 may actually raise the air temperature within the enclosure 102, so it may be desirable to apply a low climate regulator setting 124 to reduce excess intake of hot air. Conversely, if the air outside of the enclosure is very cold, applying a high climate regulator setting 124 may cause a rapid drop of air temperature within the enclosure, thus providing excessive cooling that is undesirably rapid (e.g., very cold air applied to a very hot processor) or uneven (e.g., cooling one portion of a component more rapidly than another portion), thereby disrupting the operation of the devices 104, and a low climate regulator setting 124 of the fan array 110 may be desirable.

However, because the climate regulation depicted in FIG. 1 is responsive only to conditions within the enclosure, several disadvantages may arise. As a first example, the air temperature in the enclosure 102 near the enclosure temperature sensor 122 may significantly differ from the air temperature elsewhere within the enclosure 102; e.g., cold airflow 116 directed at a device 104 may achieve undesirably rapid cooling of the device 104, but may slowly reduce the air temperature within the enclosure 102, and thus may not be detected by the enclosure temperature sensor 122 for a protracted period. As a second example, the enclosure temperature sensor 122 that fails to account for cold air temperatures outside of the enclosure 102 may initially over-power the fan array 101 and over-cool the enclosure 102, disable the fan array 110 until temperatures rise, and then reactivate the fan array 110 and again over-cool the enclosure 102. This cycling may result in wide fluctuation of air temperature within the enclosure 102 that imposes thermal stress on the devices 104, and may less efficient than maintaining a steady temperature, thus raising energy costs.

In view of these considerations, presented herein are techniques for controlling a climate regulator within an enclosure 102 by accounting for the climate properties of air outside of the enclosure 102 that is directed into the enclosure 102 during climate regulation. Such techniques may be applied in the control of a climate regulator by measuring an inlet climate property of the air directed into the enclosure, mapping the inlet climate property to a selected climate regulator setting of the climate regulator, and instructing the climate regulator to use the selected climate regulator setting. This technique may be combined with other techniques (e.g., passive climate regulator devices, and an adjustment of the selected climate regulator setting based on measurements of conditions inside the enclosure 102) to achieve more accurate and efficient cooling than may be achieved without accounting for the climate properties of the air directed into the enclosure 102.

Figure 2:
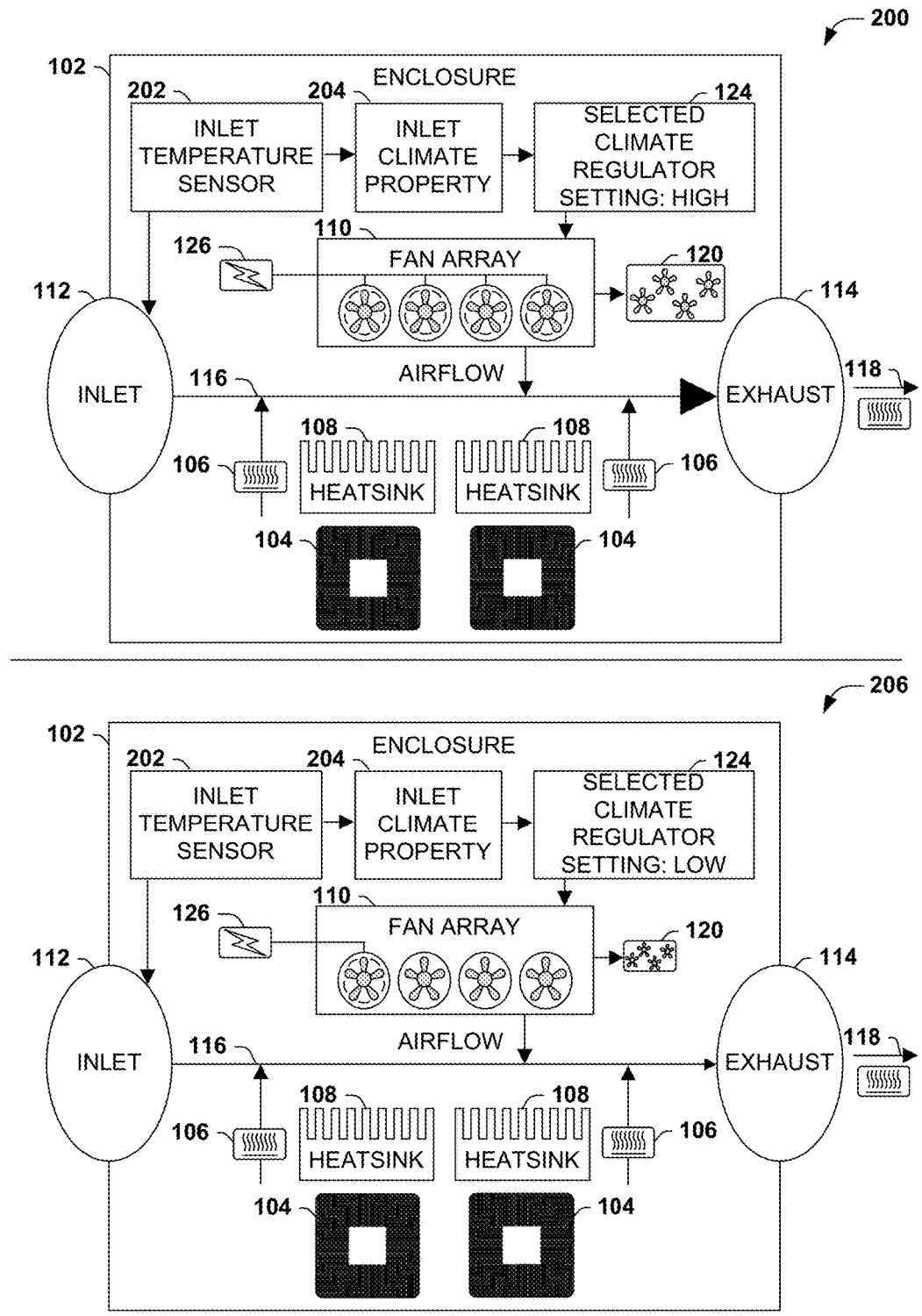
FIG. 2 is an illustration of an exemplary scenario featuring an enclosure comprising a fan array provided to manage air temperature within the enclosure according to the techniques presented herein.

FIG. 2 presents an illustration of exemplary scenarios featuring an application of the techniques presented herein. In these exemplary scenarios, an enclosure 102 comprises a set of devices 104 capable of generating heat 106, and the use of heatsinks 108 to dissipate such heat 106 into the enclosure 102. The enclosure 102 also includes a fan array 110 comprising a number of fans that may be adjusted by supplying power 126 to a variable number of fans. In accordance with the techniques presented herein, the enclosure 102 also includes an inlet temperature sensor 202 that is configured to measure an inlet climate property 204 (i.e., temperature) of the air directed into the enclosure 102 through the inlet 112 by the fan array 110. Based on the inlet climate property 204, a climate regulator setting 124 (i.e., a number of fans to utilize) may be selected and provided to the fan array 110, which may supply power 126 to the indicated number of fans in order to generate airflow 116 of variable strength, and thus provide variable cooling 120 to the devices 104. For example, at a first time point 200, the inlet temperature sensor 202 may measure that the air outside of the enclosure 102 is comparatively warm, such that a reduced temperature differential between the airflow 116 and the devices 104 may encourage an increase of airflow 116 to provide adequate cooling 120. Accordingly, a high climate regulator setting 124 may be sent to the fan array, and the fan array 110 may respond by supplying power 126 to all of the fans of the fan array 110. Additionally, at a second time point 206, the inlet temperature sensor 202 may measure the temperature of the air outside of the enclosure 102 as cool, such that adequate cooling 120 may be achieved through a small amount of airflow 116, and that heavier airflow 116 may chill the devices 104, create temperature cycling, and/or produce excessive fan noise and/or power consumption. Accordingly, a low climate regulator setting 124 may be sent to the fan array, and the fan array 110 may respond by supplying power 126 to only one of the fans of the fan array 110. In this manner, the fan array 110 may be controlled in view of the inlet climate properties 204 of the air outside of the enclosure 102 in accordance with the techniques presented herein.

C. Embodiments

Figure 3:
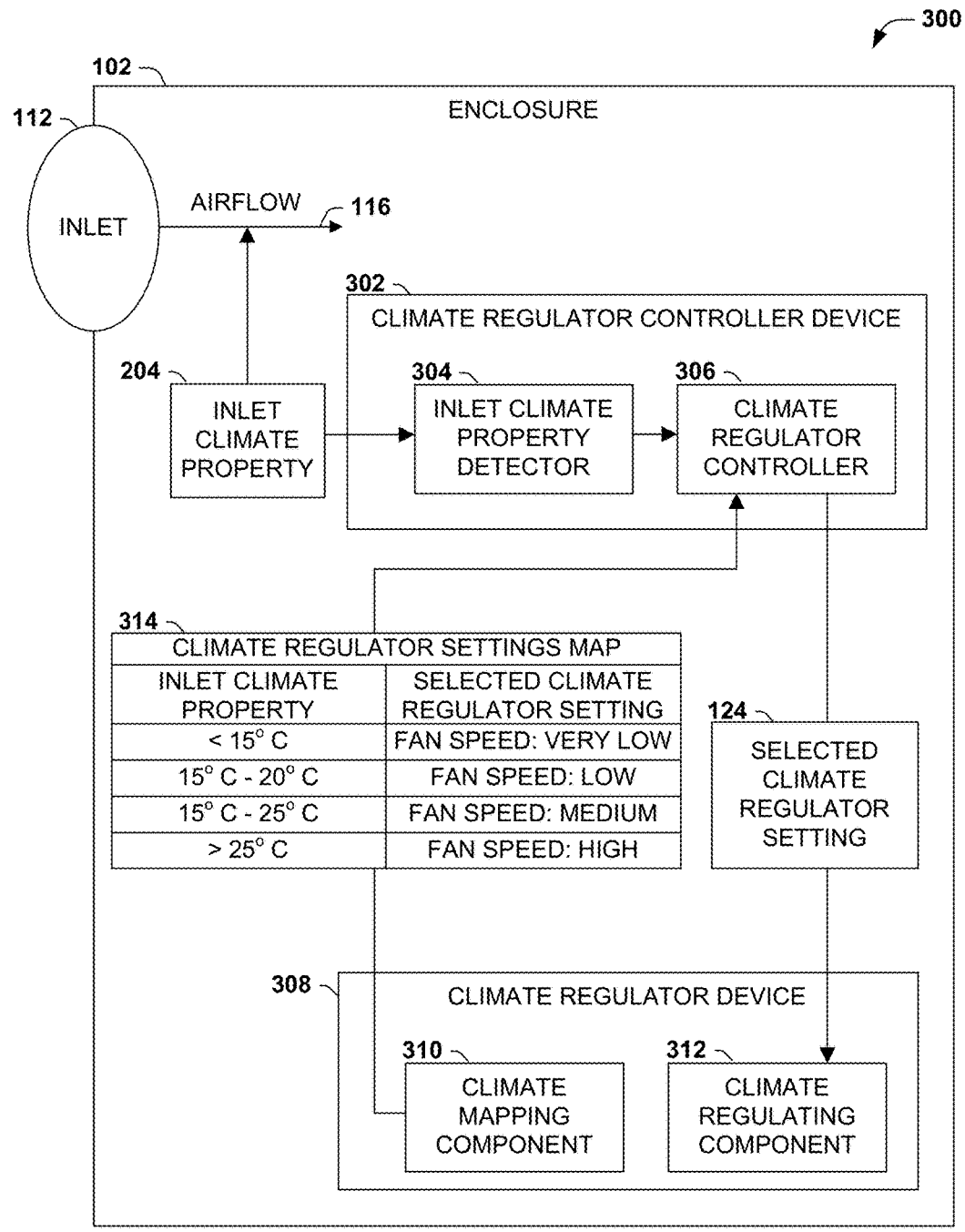
FIG. 3 is an illustration of an exemplary scenario featuring a climate regulator controller device and a climate regulator device interoperating to regulate climate within an enclosure according to the techniques presented herein.

FIG. 3 presents an illustration of an exemplary scenario 300 featuring various embodiments of the techniques presented herein. In this exemplary scenario 300, an enclosure 102 stores a set of devices 104 (e.g., one or more processors, volatile and/or nonvolatile storage devices, and communications components such as network adapters), and it may be desirable to regulate the climate within the enclosure 102 to maintain proper operation of the devices 104. Accordingly, in this exemplary scenario 300, the techniques presented herein are implemented as two interoperating components: a climate regulator device 308 configured to direct air outside of the enclosure 102 into the enclosure 102 (e.g., through an inlet 112) according to one of at least two climate regulator settings 124, and a climate regulator controller device 302 configured to control the climate regulator device 308 to achieve climate regulation within the enclosure 102. In particular, the climate regulator device 308 comprises a climate reugulating component 312 that directs air into the enclosure 102 according to one of at least two climate regulator settings 124, and a climate mapping component 310 that is configured to inform the climate regulator controller device 302 of selected climate regulator settings for respective inlet climate properties 204 of the air directed into the enclosure 102. For example, the climate regulator device 308 may store, and provide to the climate regulator controller device 302, a climate regulator settings map 314 that indicates the available set of fan speeds that are supported by the climate regulating component 213, and a suitable fan speed to be selected for respective temperature ranges of the air directed into the enclosure 102. In this manner, the climate regulator device 308 may assist a controller in selecting an appropriate climate regulator setting 124 in view of the climate outside of the enclosure 102. As another embodiment of these techniques, the climate regulator controller device 302 may comprise an inlet climate property detector 304, which is configured to measures an inlet climate property 204 of the air directed into the enclosure 102 (e.g., the temperature of the incoming air), and a climate regulator controller 306 that is configured to map the inlet climate property 204 to a selected climate regulator setting 124, and instruct the climate regulator device 308 to use the selected climate regulator setting 124. In this exemplary scenario 300, the mapping is achieved by requesting the climate regulator settings map 314 from the climate regulator device 308 and selecting the indicated climate regulator setting 124 for the inlet climate property 204 measured by the inlet climate property detector 304. In this manner, the climate regulator device 308 and the climate regulator controller device 302 may interoperate to regulate the climate within the enclosure 102 according to the techniques presented herein.

Figure 4:
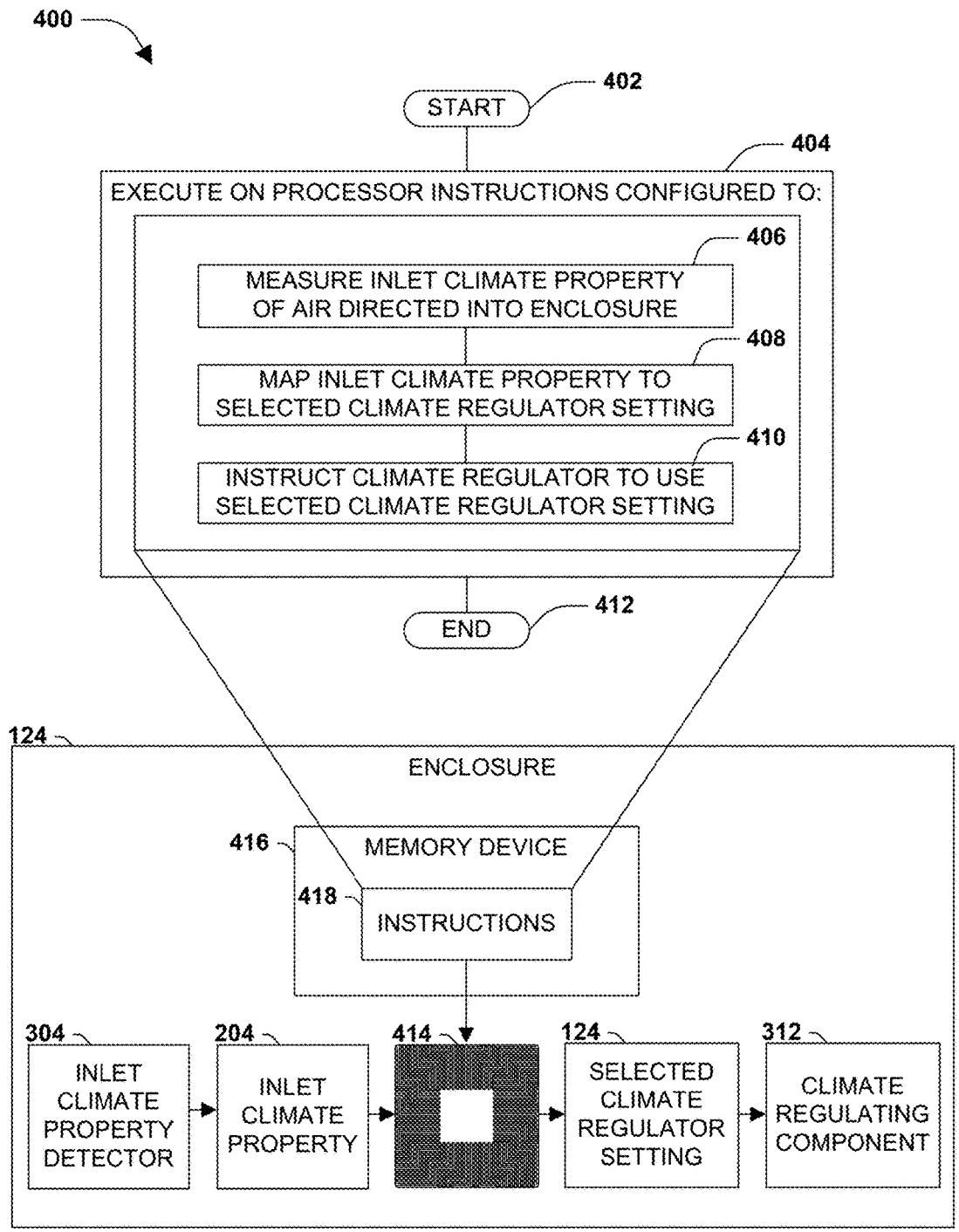
FIG. 4 is a flow diagram illustrating an exemplary method of controlling a climate regulator in accordance with the techniques presented herein.

FIG. 4 illustrates yet another embodiment of the techniques presented herein, implemented as an exemplary method 400 of controlling a climate regulator device 308 (e.g., a fan array) having at least two selectable climate regulator settings 124, to control the climate within an enclosure 102. The exemplary method 400 may be implemented, e.g., as a set of instructions 418 stored in a memory device 416 (e.g., a volatile memory circuit, a platter of a hard disk drive, a solid-state storage device, or a magnetic and/or optical disc) and executable by a processor 414 within the enclosure 124 in communication with an inlet climate property detector 304 and a climate regulating component 312. The exemplary method 400 begins at 402 and involves executing 404 the instructions 418 on the processor 414. Specifically, the instructions 418 are configured to measure 406 an inlet climate property 204 of the air directed into the enclosure 102 (e.g., by receiving a measurement from the inlet climate property detector 304); map 408 the inlet climate property 204 to a selected climate regulator setting 124; and instruct 410 the climate regulating component 312 to use the selected climate regulator setting 124. In this manner, the instructions cause the processor 414 to regulate the climate within the enclosure 102 according to the techniques presented herein.

D. Variations

The architecture presented herein for the tray 202 and the chassis 302 may be implemented with variations in many aspects, and some variations may present additional advantages and/or reduce disadvantages with respect to other variations of these and other architectures and implementations. Moreover, some variations may be implemented in combination, and some combinations may feature additional advantages and/or reduced disadvantages through synergistic cooperation.

D1. Scenarios

A first aspect that may vary among embodiments of these techniques relates to the scenarios wherein such techniques may be utilized.

As a first variation of this first aspect, the techniques presented herein may be used to regulate climate within many types of enclosures 102 storing many types of device 414. For example, the enclosures 102 may comprise a chassis and case of a workstation; the exterior of a notebook or palmtop computer; a cabinet of a server; or a rack storing a set of servers or workstation computers operating with various degrees of independence (e.g., a set of exposed mainboards with processing units comprising the blades of a multi-blade server, or a set of fully autonomous workstations that may communicate in a server/client or peer-to-peer manner or may be fully isolated from one another).

As a second variation of this first aspect, climate regulation may be provided on behalf of many types of devices 414 stored within the enclosure 124, such as microprocessors; volatile memory circuits; nonvolatile storage devices such as hard disk drives and solid-state storage devices; input/output devices, such as display adapters, sound renderers, video and audio devices, and media encoding and decoding circuits; communications components, such as network adapters, switches, hubs, routers, modems, transceivers, and repeaters; and infrastructure components, such as mainboards and buses.

As a third variation of this first aspect, many inlet climate properties 204 may be measured and regulated by many types of climate regulating components 312. As a first such example, inlet air temperature may be measured by a thermometer, and may be regulated by air conditioners and heaters. As a second such example, inlet humidity may be measured by a manometer, and may be regulated by humidifiers and dehumidifiers. As a third such example, inlet air pressure may be achieved by a barometer, and may be regulated by compressors configured to direct air into or out of the enclosure 102. As a fourth such example, inlet airflow may be measured by a flow meter, and may be regulated by fans and windscreens. As a fifth such example, inlet particulate content may be measured by an optical detector, and may be regulated by electrostatic air filters. These and other scenarios may advantageously utilize the techniques presented herein.

D2. Measuring Inlet Climate Properties

A second aspect that may vary among embodiments of these techniques relates to the manner of measuring 406 the inlet climate property 204 of air directed into the enclosure 124.

As a first variation of this second aspect, the inlet climate properties 204 may be measured by an inlet climate property detector 304 positioned on the outside of the enclosure 102, within the enclosure 102 near an inlet 112, or within the incoming airflow 116.

As a second variation of this second aspect, the inlet climate properties 204 may be received from a climate property detector in the same area as the enclosure 102 (e.g., a thermometer positioned in the same room as the enclosure 102, and configured to report the temperature within the room to a set of enclosures 102), or a climate regulator device outside of the enclosure 102 and set to regulate one or more climate properties of the air outside of the enclosure 102 (e.g., a heating, ventilation, and air conditioning (HVAC) system configured to report its target settings for air generated in the vicinity of the enclosure 102).

As a third variation of this second aspect, the inlet climate properties 204 may be reported by a climate reporting service that may be queried to report the climate detected at a particular location (e.g., a weather service that may report air climate conditions for selected regions). For climate regulators that draw air into an enclosure from an outdoor location (e.g., enclosures 102 of devices that are usable outdoors, or of a computer positioned in an automobile and configured to provide climate regulation through an inlet vent), an embodiment of these techniques may detect the inlet climate properties 204 by querying the climate reporting service to determine inlet climate properties of the current climate in the location of the enclosure 102. Moreover, some such embodiments may include a location detector (e.g., a global positioning service (GPS) receiver), and may invoke the location detector for a location identifier (e.g., a set of latitude and longitude coordinates) identifying the location of the enclosure 102 that may be sent to the climate reporting service to query the inlet climate properties 204 of the current location of the enclosure 102.

As a fourth variation of this second aspect, the inlet climate properties 204 may be measured partly or wholly by prediction. As a first such example, a climate detector may measure climate properties of a location over a period of time (e.g., an ordinary cycling of temperature in a room of a building), and may generate predictions of such temperature that inform the selection of climate regulator settings 124 at particular times. Those of ordinary skill in the art may devise many ways of measuring inlet climate properties 204 of air directed into the enclosure 102 in accordance with the techniques presented herein.

D3. Mapping Inlet Climate Property to Climate Regulator Setting

A third aspect that may vary among embodiments of these techniques relates to the mapping 408 of inlet climate properties 204 to selected climate regulator settings 124.

As a first variation of this third aspect, the mapping 408 may be calculated on an ad hoc basis by a circuit or a set of instructions executing on a processor 414.

As a second variation of this third aspect, appropriate climate regulator settings 124 for respective inlet climate properties 204 may be specified in a climate regulator settings map 314, which may be generated and/or communicated to a climate regulator controller device 302 in various ways. As a first example of this second variation of this third aspect, the climate regulator settings map 314 may be encoded in a firmware within the climate regulator device 308, or within a software driver provided for the climate regulator device 308. A climate regulator controller device 302 may therefore query the climate regulator device 308 for the climate regulator settings map 314 (e.g., upon detecting an installation of the climate regulator device 308) and store the climate regulator settings map 314 for later reference in selecting a climate regulator setting 124 suitable for a current inlet climate property 204.

As a second example of this second variation of this third aspect, a climate regulator settings map 314 may be generated by the climate regulator controller device 302 in a trial-and-error manner, based on various climate regulation properties resulting from operating the climate regulator device 308 at various settings. For example, the climate regulator controller device 302 may be configured to measure a climate regulation property (e.g., a resulting air temperature within the enclosure 102) while operating the climate regulator at respective climate regulator settings 124, and may compare the climate regulation properties achieved by respective climate regulator settings to identify a selected climate regulator setting 124. This technique may enable a mapping of inlet climate properties 204 to climate regulation properties (e.g., climate regulator settings 124 that may achieve a target enclosure air temperature in view of the temperature of the air intake), thereby achieving both a selectivity of suitable climate regulator settings 124 in the specific context of the enclosure 102, as well as a feedback-based learning technique to adapt the selection of climate regulator settings 124 to changing conditions.

As a third example of this second variation of this third aspect, the climate regulator settings map 314 may be retrieved from a climate regulator descriptor service, e.g., a service that tracks performance metrics for climate regulator devices 308 (e.g., the availability of climate regulator settings 124 for respective climate regulator device 308) and provides recommendations of selected climate regulator settings 124 for respective inlet climate properties 204. A climate regulator controller device 302 may therefore retrieve a climate regulator identifier from the climate regulator device 308 (e.g., a hardware serial number or model number), and may send the climate regulator identifier to the climate regulator descriptor service in order to retrieve the climate regulator settings map 314 for the climate regulator device 308. Moreover, the climate regulator controller device 302 may, upon generating and/or updating the climate regulator settings map 314, send the climate regulator identifier and the generated or updated climate regulator settings map 314 to the climate regulator descriptor service. In this manner, the identification of recommended climate regulator settings 124 for respective inlet climate properties 204 may be "crowdsourced," and may be determined by automated consensus based on feedback from many such devices operating in the field.

As a third variation of this third aspect, the mapping 408 may utilize other considerations while selecting climate regulator settings 124 for respective inlet climate properties 314. For example, the mapping may also incorporate measurements of climate conditions inside the enclosure 102, or the number and types of devices 104 stored in the enclosure 102; e.g., the number and types of processors may determine a target climate within the enclosure 102. Alternatively or additionally, the mapping 408 may utilize operating properties of devices 104 within the enclosure 102, which may be predictive of imminent climate changes within the enclosure 102. For example, a high processor load of one or more processors 414 operating within the enclosure 102 may predict imminent heating of the air within the enclosure 102, and/or may warrant a preemptive cooling of the air within the enclosure 102 to maintain the temperature of the processor despite an increased processor load. As another example, the I/O queue size, rotational velocities, and/or power consumption of hard disk drives operating within the enclosure may be included in the selection of a climate regulator setting 124, since these properties may be predictive of an imminent rise in temperature within the enclosure 102 and/or increased demand for climate regulation. These factors may be utilized in combination with the inlet climate properties 204; e.g., a selected climate regulator setting 124 selected for a particular inlet climate property 204 may be adjusted in view of these other factors, or a multi-dimensional climate regulator settings map 314 may enable a selection of a climate regulator setting 124 in view of both the inlet climate property 204 and other factors within the enclosure 102.

As a fourth variation of this third aspect, the mapping may incorporate a decision-making capability of a user, such as an administrator of the devices 104 within the enclosure 102. As a first such example, the climate regulator settings map 314 may be specified by a user, such as an administrator who may specify climate regulator settings 124 to apply to the climate regulator device 308 in response to respective inlet climate properties 204. As a second such example, the results of the mapping 408 may be reported to a user. For example, if the mapping results in a selection of a climate regulator setting 124 that the climate regulator device 308 is not operable at a selected climate regulator setting 124 (e.g., an airflow rate that is not achievable by a fan array 110), an embodiment may present to the user a recommendation to acquire a substitute climate regulator that is operable at the selected climate regulator setting 124. Those of ordinary skill in the art may devise many variations in the mapping 408 of inlet climate properties 204 to selected climate regulator settings 124 in accordance with the techniques presented herein.

D4. Controlling Climate Regulator

A fourth aspect that may vary among embodiments of these techniques relates to the controlling of the climate regulator according to the selected climate regulator setting 124.

As a first variation of this fourth aspect, the climate regulating component 312 may comprise a series of climate regulator units, each supporting at least one climate regulator setting 124. For example, a fan array 110 may comprise at least two fans, each operable at one fan speed, and that together provide a magnitude of airflow 116 linearly proportional to the number of activated fans. Alternatively, the fan array 110 may comprise two or more fans operable at different fan speeds, and may select a combination of fans to achieve a selected climate regulator setting 124. Such variations may improve the range of climate regulator settings 124 supported by the climate regulator device 308, as well as the flexibility of the climate regulator device 308 to adapt to failures of particular units (e.g., upon detecting a failed climate regulator unit that is not responsive or not performing as expected, the climate regulator device 308 may select a different combination of the climate regulator units, excluding the failed climate regulator unit, to achieve the selected climate regulator setting 124, as well as notifying a user of the failed climate regulator unit).

As a second variation of this fourth aspect, the enclosure 102 may be operably coupled with an enclosure management component that is configured to monitor and log a broad range of conditions of the enclosure 102 in order to achieve holistic regulation of the devices 104 and the enclosure 102. An embodiment may interoperate with the enclosure management component by reporting operation of the climate regulator device 308 to the enclosure management component, and/or, upon receiving an instruction to instruct the climate regulator device 308 to use a selected climate regulator setting 124, instructing the climate regulator device 408 to use the selected climate regulator setting 124.

Figure 5:
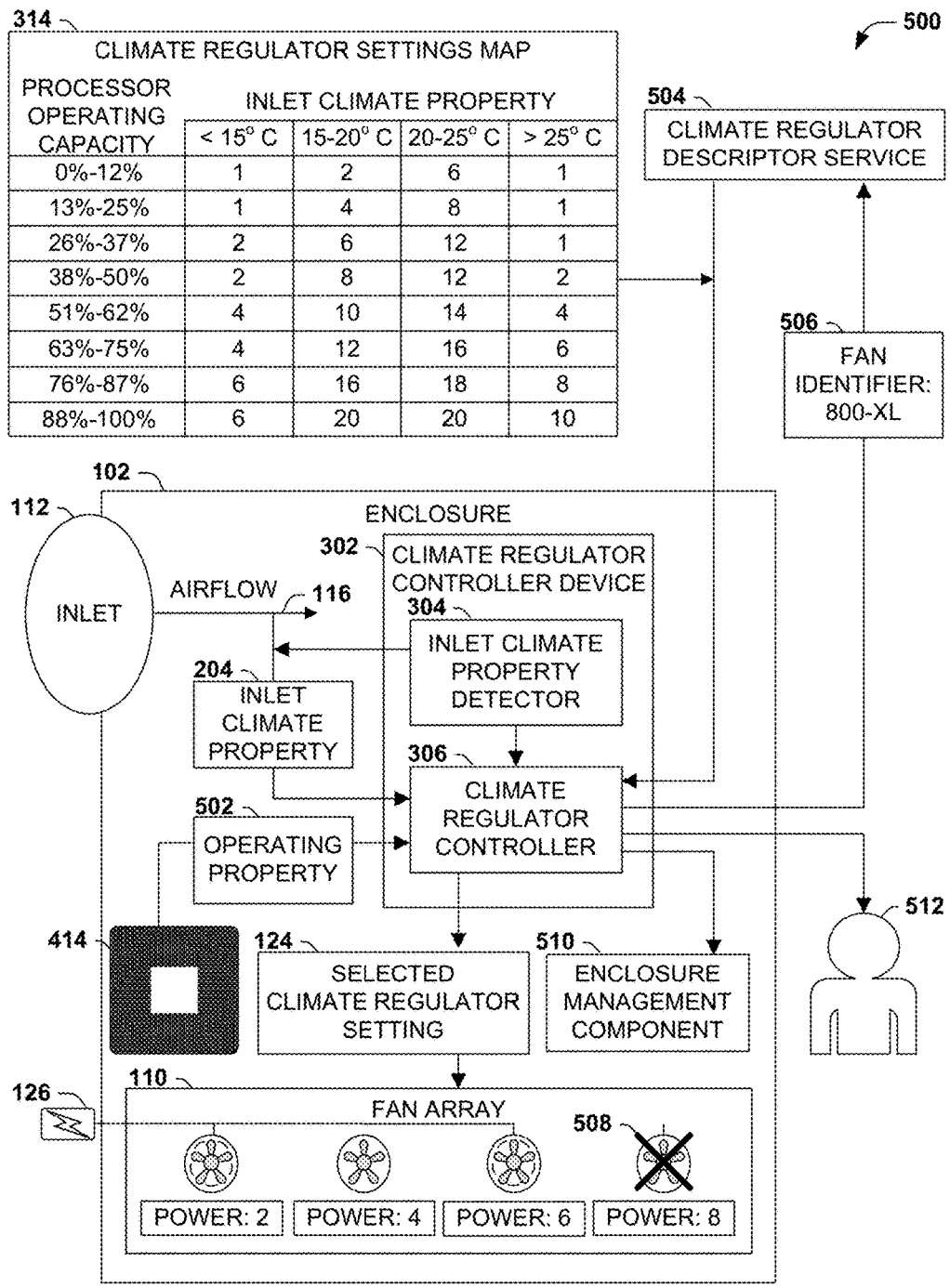
FIG. 5 is an illustration of an exemplary scenario featuring several variations of control of climate regulators in accordance with the techniques presented herein.

FIG. 5 presents an illustration of an exemplary scenario 500 featuring an embodiment incorporating several of the variations of respective aspects presented herein. In this exemplary scenario 500, an enclosure 102 is configured to store and operate a processor 414. In order to regulate the climate within the enclosure 102, a climate regulator controller device 302 may be provided, comprising an inlet climate property detector 304 configured to detect an inlet climate property 204 of the air directed into the enclosure 102 through an inlet 112, and a climate regulator controller 306 configured to instruct a fan array 110 to use a selected climate regulator setting 124 based on the inlet climate property 204. However, the climate regulator controller 306 also selects the climate regulator setting 124 using an operating property 502 within the enclosure 102, i.e., the processor operating capacity of the processor 414. Moreover, this selection may be encoded in the climate regulator settings map 314, which may be specified as a two-dimensional map enabling a selection of a climate regulator setting 124 based on both the inlet climate property 204 and the operating property 502. Moreover, this two-dimensional climate regulator settings map 314 is obtained by the climate regulator controller device 302 from a climate regulator descriptor service 504; e.g., the climate regulator controller device 302 may detect and send to the climate regulator descriptor service 504 a climate regulator identifier (e.g., a model number of the fan array 110), and may receive the two-dimensional climate regulator settings map 314 for the specified fan array 110 from the climate regulator descriptor service 504. Additionally, if a failure 508 of a climate regulator unit is detected, the fan array 110 and climate regulator controller device 302 may be configured to select a different combination of climate regulator units (excluding the failed unit) to achieve the selected climate regulator setting 124. Finally, the climate regulator controller device 302 may communicate status information to and/or receive instructions from an enclosure management component 510 and/or a user 512. In this manner, the climate regulator controller device 302 operates the fan array 110 in order to achieve climate regulation within the enclosure 102 according to several of the variations of the techniques presented herein. Those of ordinary skill in the art may devise many such variations while implementing the techniques presented herein.

E. Computing Environment

Figure 6:
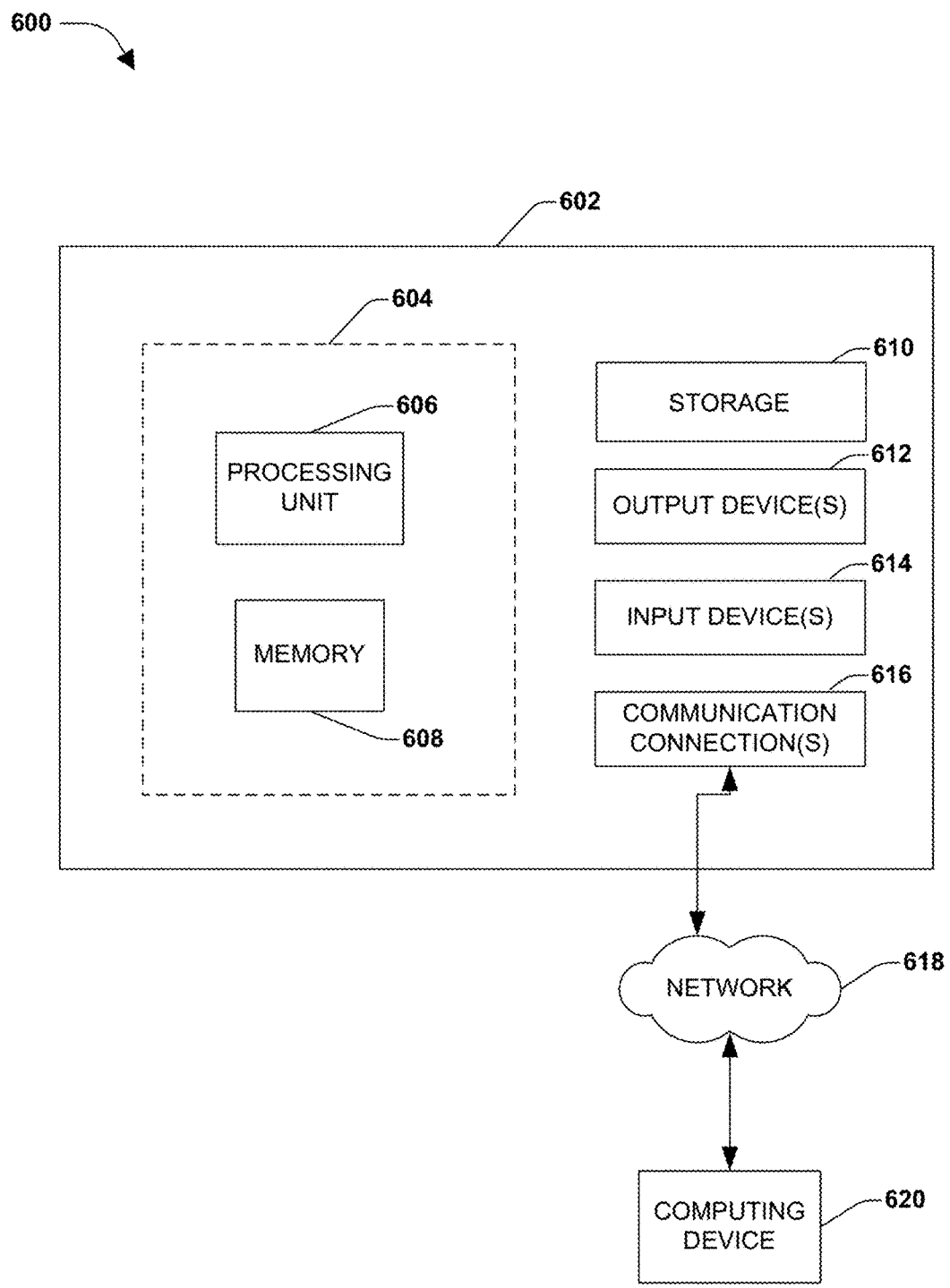
FIG. 6 is an illustration of an exemplary computing environment wherein one or more of the provisions set forth herein may be implemented.

FIG. 6 presents an illustration of an exemplary computing environment within a computing device 602 wherein the techniques presented herein may be implemented. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, and distributed computing environments that include any of the above systems or devices.

FIG. 6 illustrates an example of a system 600 comprising a computing device 602 configured to implement one or more embodiments provided herein. In one configuration, the computing device 602 includes at least one processor 606 and at least one memory component 608. Depending on the exact configuration and type of computing device, the memory component 608 may be volatile (such as RAM, for example), non-volatile (such as ROM, flash memory, etc., for example) or an intermediate or hybrid type of memory component. This configuration is illustrated in FIG. 6 by dashed line 604.

In some embodiments, device 602 may include additional features and/or functionality. For example, device 602 may include one or more additional storage components 610, including, but not limited to, a hard disk drive, a solid-state storage device, and/or other removable or non-removable magnetic or optical media. In one embodiment, computer-readable and processor-executable instructions implementing one or more embodiments provided herein are stored in the storage component 610. The storage component 610 may also store other data objects, such as components of an operating system, executable binaries comprising one or more applications, programming libraries (e.g., application programming interfaces (APIs), media objects, and documentation. The computer-readable instructions may be loaded in the memory component 608 for execution by the processor 606.

The computing device 602 may also include one or more communication components 616 that allows the computing device 602 to communicate with other devices. The one or more communication components 616 may comprise (e.g.) a modem, a Network Interface Card (NIC), a radiofrequency transmitter/receiver, an infrared port, and a universal serial bus (USB) USB connection. Such communication components 616 may comprise a wired connection (connecting to a network through a physical cord, cable, or wire) or a wireless connection (communicating wirelessly with a networking device, such as through visible light, infrared, or one or more radiofrequencies.

The computing device 602 may include one or more input components 614, such as keyboard, mouse, pen, voice input device, touch input device, infrared cameras, or video input devices, and/or one or more output components 612, such as one or more displays, speakers, and printers. The input components 614 and/or output components 612 may be connected to the computing device 602 via a wired connection, a wireless connection, or any combination thereof. In one embodiment, an input component 614 or an output component 612 from another computing device may be used as input components 614 and/or output components 612 for the computing device 602.

The components of the computing device 602 may be connected by various interconnects, such as a bus. Such interconnects may include a Peripheral Component Interconnect (PCI), such as PCI Express, a Universal Serial Bus (USB), firewire (IEEE 794), an optical bus structure, and the like. In another embodiment, components of the computing device 602 may be interconnected by a network. For example, the memory component 608 may be comprised of multiple physical memory units located in different physical locations interconnected by a network.

Those skilled in the art will realize that storage devices utilized to store computer readable instructions may be distributed across a network. For example, a computing device 620 accessible via a network 618 may store computer readable instructions to implement one or more embodiments provided herein. The computing device 602 may access the computing device 620 and download a part or all of the computer readable instructions for execution. Alternatively, the computing device 602 may download pieces of the computer readable instructions, as needed, or some instructions may be executed at the computing device 602 and some at computing device 620.

F. Usage of Terms

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of controlling a climate regulator of an enclosure of a device, the climate regulator configured to direct air from outside the enclosure into the enclosure according to one of at least two climate regulator settings, the method comprising:
   measuring an inlet climate property of the air directed into the enclosure;
   mapping the inlet climate property to a selected climate regulator setting; and
   instructing the climate regulator to use the selected climate regulator setting, thereby directing air from outside the enclosure into the enclosure using the climate regulator according to the selected climate regulator setting, wherein:
      the enclosure is positioned in a location; and
      measuring the inlet climate property comprising:
         invoking the location detector for a location identifier of the location of the enclosure; and
         sending the location identifier to a climate reporting service for querying the inlet climate property based on the location identifier.

2. The method of claim 1, the inlet climate property selected from an inlet climate property set comprising at least one of:
   an inlet air temperature;
   an inlet air pressure;
   an inlet humidity;
   an inlet airflow; or
   an inlet particulate content.

3. The method of claim 1:
   the enclosure comprising an inlet climate property detector configured to measure an inlet climate property of the air directed into the enclosure; and
   measuring the inlet climate property comprising receiving the inlet climate property from the inlet climate property detector in the enclosure.

4. The method of claim 1, further comprising:
   detecting an operating property of the device within the enclosure; and
   wherein mapping the inlet climate property further comprising mapping the inlet climate property and the operating property of the device to a selected climate regulator setting.

5. The method of claim 1, further comprising:
   upon receiving a climate regulator settings map specifying a selected climate regulator setting for respective inlet climate properties, storing the climate regulator settings map; and
   wherein mapping the inlet climate property comprising using the climate regulator settings map, selecting a selected climate regulator setting for the inlet climate property.

6. The method of claim 5 wherein receiving the climate regulator settings map comprising upon receiving from a user a selected climate regulator setting for an inlet climate property, storing selected climate regulator setting and the inlet climate property in the climate regulator settings map.

7. The method of claim 5 wherein receiving the climate regulator settings map comprising receiving the climate regulator settings map from the climate regulator.

8. The method of claim 5 wherein receiving the climate regulator settings map comprising:
   measuring an inlet climate property of the air flowing into the enclosure;
   while operating the climate regulator at at least two climate regulator settings, measuring a climate regulation property; and
   comparing the climate regulation properties of respective climate regulator settings to identify a selected climate regulator setting for the inlet climate property.

9. The method of claim 8, further comprising:
   while operating the climate regulator at a selected climate regulator setting, measuring a climate regulation property; and
   using the climate regulation property, updating the selected climate regulator setting for the inlet climate property in the climate regulator settings map.

10. A method of controlling a climate regulator of an enclosure of a device, the climate regulator configured to direct air from outside the enclosure into the enclosure according to one of at least two climate regulator settings, the method comprising:
    receiving a climate regulator settings map;
    measuring an inlet climate property of the air directed into the enclosure;
    mapping the inlet climate property to a selected climate regulator setting based on the received climate regulator settings map specifying a selected climate regulator setting for respective inlet climate properties;
    instructing the climate regulator to use the selected climate regulator setting, thereby directing air from outside the enclosure into the enclosure using the climate regulator according to the selected climate regulator setting; and
    wherein receiving the climate regulator settings map includes:
       retrieving from the climate regulator a climate regulator identifier;
       sending the climate regulator identifier to a climate regulator descriptor service; and
       receiving the climate regulator settings map for the climate regulator from the climate regulator descriptor service.

11. The method of claim 10 further comprising, upon updating the climate regulator settings map, sending the climate regulator identifier and the climate regulator settings map to the climate regulator descriptor service.

12. The method of claim 10, further comprising upon determining that the selected climate regulator setting is not operable at the climate regulator, presenting to a user a recommendation to acquire a substitute climate regulator operable at the selected climate regulator setting.

13. The method of claim 10 wherein:
    the climate regulator comprising at least two climate regulator units respectively operable at at least one climate regulator setting; and
    instructing the climate regulator comprising instructing the climate regulator to select at least one of the at least two climate regulator units to achieve the climate regulator setting.

14. The method of claim 13, further comprising upon detecting a failed climate regulator unit, instructing the climate regulator to select the climate regulator units excluding the failed climate regulator unit to achieve the selected climate regulator setting.

15. The method of claim 14, further comprising upon detecting the failed climate regulator unit, notifying a user of the failed climate regulator unit.

16. The method of claim 10 wherein:
    the enclosure is operably coupled with an enclosure management component; and the method further comprising:
reporting operation of the climate regulator component to the enclosure management component; and
upon receiving an instruction to instruct the climate regulator to use another selected climate regulator setting, instructing the climate regulator to use the another selected climate regulator setting.

17. A method of controlling a climate condition in an enclosure containing an electronic device in an internal space of the enclosure, the enclosure having an air inlet and an air outlet, wherein the enclosure further includes a fan array configured to draw cooling air from an environment outside of the enclosure into the internal space of the enclosure before exiting the enclosure to the environment outside of the enclosure, the method comprising:
monitoring an inlet climate property of the cooling air by analyzing an ambient climate condition of the environment outside of the enclosure;
mapping the determined inlet climate property to a selected fan array setting from a plurality of fan array settings, the selected fan array setting corresponding to a predetermined amount of cooling air with the inlet climate property to be introduced into the enclosure to sufficiently cool the electronic device; and
instructing the fan array to use the selected fan array setting, thereby introducing, using the fan array according to the selected fan array setting, the amount of cooling air from the environment outside of the enclosure into the internal space of the enclosure, the cooling air flowing from the air inlet, past the electronic device, and existing the enclosure via the air outlet, thereby carrying heat generated by the electronic device to the environment outside the enclosure.

18. The method of claim 17, further comprising:
detecting an operating property of the electronic device within the enclosure; and
wherein mapping the determined inlet climate property further comprising mapping both the determined inlet climate property and the operating property of the electronic device to the selected climate regulator setting.

19. The method of claim 17 wherein:
analyzing the ambient climate condition of the environment outside of the enclosure includes:
analyzing an ambient temperature of the environment outside of the enclosure;
determining whether the ambient temperature is below a threshold temperature; and
in response to determining that the ambient temperature is below a threshold temperature, indicating that the inlet climate property includes that a temperature of the cooling air is low;
wherein mapping the determined inlet climate property comprising selecting a fan array setting that corresponds to a low flow rate of the cooling air.

20. The method of claim 17 wherein:
analyzing the ambient climate condition of the environment outside of the enclosure includes:
analyzing an ambient temperature of the environment outside of the enclosure;
determining whether the ambient temperature is above a threshold temperature; and
in response to determining that the ambient temperature is above a threshold temperature, indicating that the inlet climate property includes that a temperature of the cooling air is high;
wherein mapping the determined inlet climate property comprising selecting a fan array setting that corresponds to a high flow rate of the cooling air.

* * * * *